(12) United States Patent
Kim (10) Patent No.: US 8,143,782 B2
(45) Date of Patent: Mar. 27, 2012

(54) ORGANIC LIGHT EMITTING DISPLAY

(75) Inventor: Eun-Ah Kim, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 548 days.

(21) Appl. No.: 11/854,099

(22) Filed: Sep. 12, 2007

(65) Prior Publication Data

US 2008/0218062 A1 Sep. 11, 2008

(30) Foreign Application Priority Data

Mar. 7, 2007 (KR) .................. 10-2007-0022663

(51) Int. Cl.
*H01L 23/02* (2006.01)
*H01L 23/053* (2006.01)

(52) U.S. Cl. .................. 313/506; 313/504; 313/509

(58) Field of Classification Search ........... 313/483–512
See application file for complete search history.

(56) References Cited

U.S. PATENT DOCUMENTS

| 2005/0088591 | A1* | 4/2005 | Lee et al. | 349/113 |
| 2005/0110023 | A1* | 5/2005 | Lee et al. | 257/72 |
| 2005/0233170 | A1* | 10/2005 | Yamazaki | 428/690 |
| 2006/0071350 | A1* | 4/2006 | Fan et al. | 257/784 |

FOREIGN PATENT DOCUMENTS

| KR | 2002-7713 | 1/2002 |
| KR | 2005-49999 | 5/2005 |

OTHER PUBLICATIONS

U.S. Appl. No. 11/854,119, filed Sep. 12, 2007, Eun-Ah Kim, Samsung SDI Co., Ltd.

* cited by examiner

*Primary Examiner* — Joseph L Williams
*Assistant Examiner* — Nathaniel Lee
(74) *Attorney, Agent, or Firm* — H.C. Park & Associates, PLC (57) ABSTRACT

An organic light emitting display that can avoid or reduce scratched wires and dark spot defects. The organic light emitting display includes a pixel substrate having an organic light emitting element formed on a pixel region and wires having pads formed around the pixel region, a passivation layer formed on the organic light emitting element and the wires, and an encapsulation substrate formed on the pixel substrate to protect the pixel region.

9 Claims, 8 Drawing Sheets

RELATED ART

ORGANIC LIGHT EMITTING DISPLAY

CROSS-REFERENCE TO RELATED APPLICATION

This application claims the benefit of Korean Application No. 2007-22663, filed Mar. 7, 2007 in the Korean Intellectual Property Office, the disclosure of which is incorporated herein by reference.

BACKGROUND OF THE INVENTION

1. Field of the Invention

Aspects of the present invention relate to an organic light emitting display, and more particularly, to an organic light emitting display that can avoid or reduce scratched wires and dark spot defects.

2. Description of the Related Art

An organic light emitting display is a self-emitting display that uses a phenomenon in which electrons and positive holes injected into an organic material through an anode and a cathode, respectively, are recombined to form excitons. The excitons thereby generate a light beam with a specific wavelength to release energy. The organic light emitting display does not require a separate light source, such as a backlight, resulting in low or lower power consumption. Furthermore, since a wide viewing angle and a fast response time of the organic light emitting display can be easily ensured, the organic light emitting display is expected to be a next generation display.

In terms of a driving method, the organic light emitting display is classified into a passive matrix type and an active matrix type. In recent years, the active matrix type organic light emitting display has become more prevalent over the passive matrix type organic light emitting display. The active matrix type organic light emitting display enables realization of low power consumption, high definition, fast response time, wide viewing angle, and light thin film characteristics.

In an active matrix type organic light emitting display, a pixel region is formed on a pixel substrate where an image is to be displayed. Furthermore, wires are provided around the pixel region along with a data driver and a scan driver to drive the pixel region in response to a signal input through pads of the wires. Pixels, each of which is a basic unit for image display, are arranged on the pixel region in a matrix form. An organic light emitting element is provided for each pixel such that a first pixel electrode of a positive polarity and a second pixel electrode of a negative polarity are sequentially formed with an emitting layer interposed therebetween. The emitting layer includes a red (R), green (G), and/or blue (B) organic material. In each of the pixels, a thin film transistor (TFT) is in contact with the organic light emitting element so that the pixels can be independently controlled.

Figure 6A:
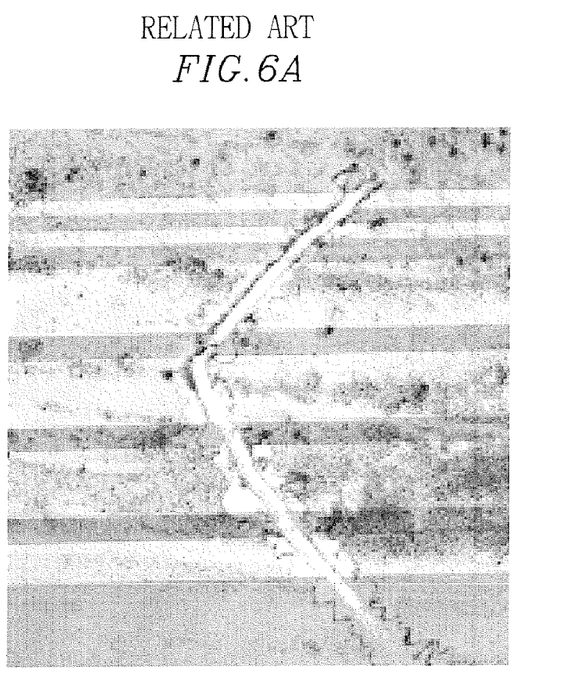
FIG. 6A is a microscopic view of an image.
Figure 6B:
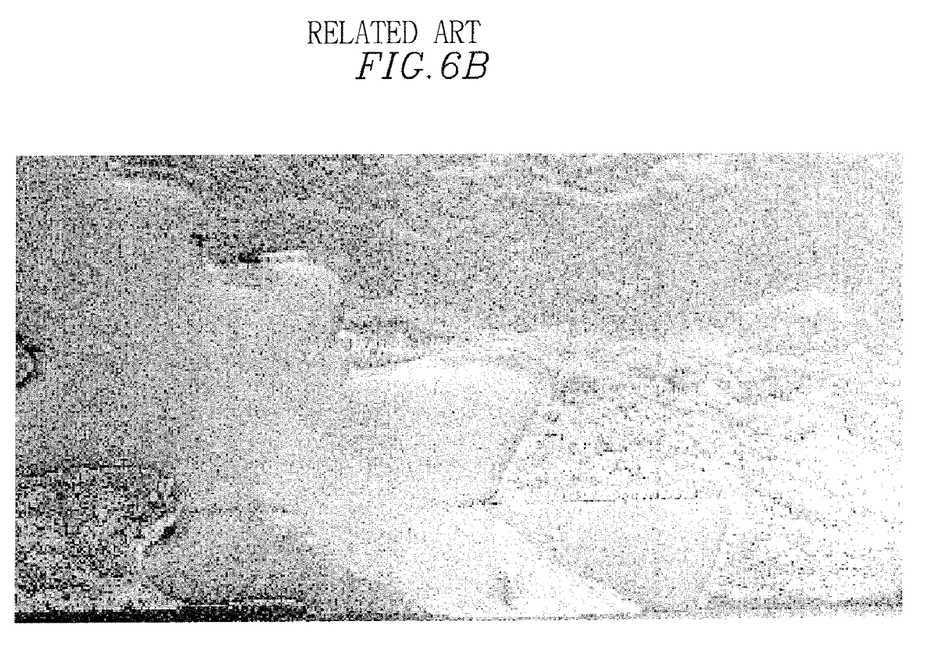
FIG. 6B is a focused ion beam (FIB) image.
Figure 6C:
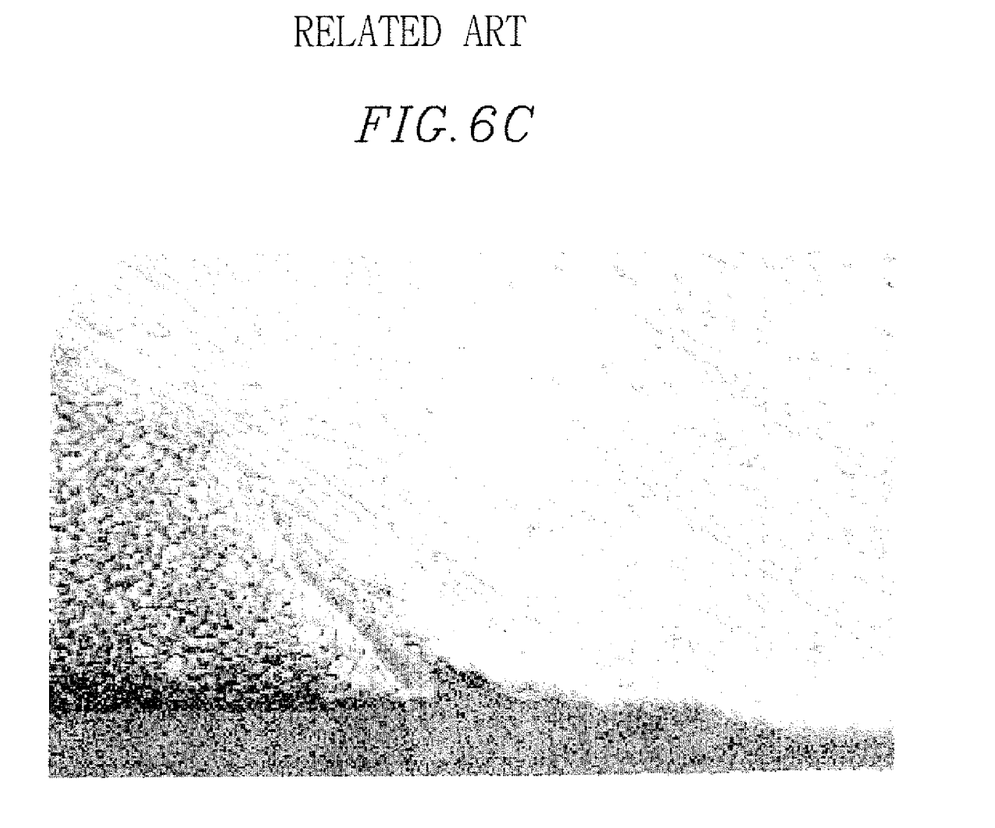
FIG. 6C is a partially enlarged view of the image of FIG. 6B.

In the organic light emitting display, the pixel substrate is encapsulated by an encapsulation substrate in order to protect the pixels. However, the wires and the pads are vulnerable to an externally imposed physical impact as the wires and the pads are not encapsulated to enable receipt of an external signal. In particular, as shown in FIGS. 6A, 6B, and 6C, if the wires are scratched, an electrical short may occur between the wires. As a result, driving of the pixel may be performed erroneously.

Figure 7:
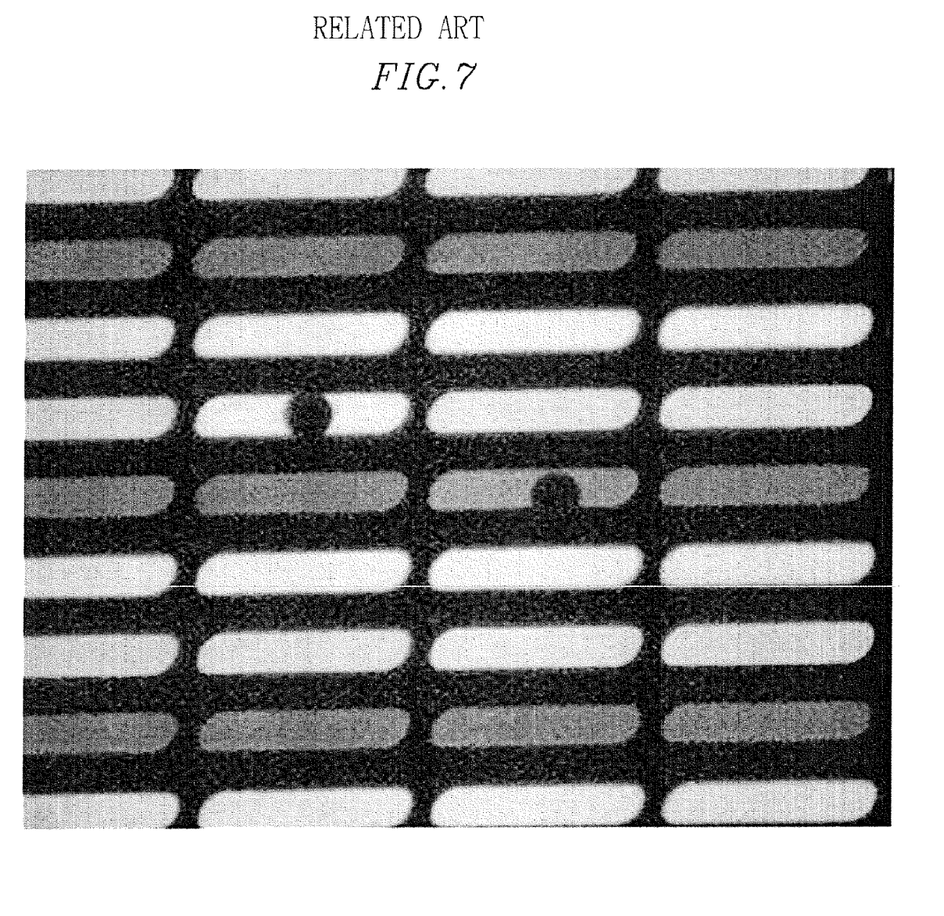
FIG. 7 is a view illustrating a pin hole formed in a second pixel electrode in the related organic light emitting display.

Moreover, if the second pixel electrode of the organic light emitting display is formed to be thin in the shape of a front electrode, a pin hole may be formed in the second pixel electrode as shown in FIG. 7, to result in dark spot defects. Accordingly, display quality of the organic light emitting display deteriorates.

SUMMARY OF THE INVENTION

Aspects of the present invention provide an organic light emitting display that can avoid scratched wires and dark spot defects, and other advantages.

According to an aspect of the present invention, an organic light emitting display includes a pixel substrate having an organic light emitting element formed on a pixel region, and wires having pads formed around the pixel region; a passivation layer formed on the organic light emitting element and the wires (also known as connection wires); and an encapsulation substrate formed on the pixel substrate to protect the pixel region.

In an aspect of the present invention, the organic light emitting element may have a first pixel electrode, an organic emission layer, and a second pixel electrode that are sequentially laminated. Further, the second pixel electrode may be formed over the entire surface of the pixel region. Further, the passivation layer may be formed over the entire surface of the second pixel electrode.

In an aspect of the present invention, the organic light emitting display may further include a thin film transistor, wherein the organic light emitting element is formed on the thin film transistor; and a planarization layer formed between the organic light emitting element and the thin film transistor to cover the wires and the pads.

In an aspect of the present invention, a via-hole may be formed in the planarization layer, and the organic light emitting element is electrically connected to the thin film transistor through the via-hole.

In an aspect of the present invention, a pad contact-hole may be formed in the planarization layer, and the pads are exposed through the pad contact-hole.

In an aspect of the present invention, the thin film transistor may include an active layer formed on the pixel substrate; a gate insulation layer formed on the entire surface of the pixel substrate to cover the active layer; a gate electrode formed on the gate insulation layer; an interlayer insulation layer formed on the gate insulation layer to cover the gate electrode; and source and drain electrodes formed on the interlayer insulation layer and electrically connected to the active layer through a contact-hole of the interlayer insulation layer.

In an aspect of the present invention, the wires and the pads may be formed on the interlayer insulation layer.

According to another aspect of the present invention, an organic light emitting display includes a pixel substrate having an organic light emitting element formed on a pixel region, and wires having pads formed around the pixel region; a passivation layer formed above the organic light emitting element, the wires, and the pads; and an encapsulation substrate formed on the pixel substrate to protect the pixel region, wherein an opening portion is formed in the passivation layer, and the pads are exposed through the opening portion.

In an aspect of the present invention, the organic light emitting element may have a first pixel electrode, an organic emission layer, and a second pixel electrode that are sequentially laminated. Further, the second pixel electrode may be formed over the entire surface of the pixel region. Further, the passivation layer may be formed over the entire surface of the second pixel electrode.

In an aspect of the present invention, the organic light emitting display may further include a thin film transistor, wherein the organic light emitting element is formed on the thin film transistor; and a planarization layer formed between the organic light emitting element and the thin film transistor to cover the wires.

In an aspect of the present invention, a via-hole may be formed in the planarization layer, and the organic light emitting element is electrically connected to the thin film transistor through the via-hole.

In an aspect of the present invention, a pad contact-hole passing through the opening portion of the passivation layer may be formed in the planarization layer.

In an aspect of the present invention, the thin film transistor may include: an active layer formed on the pixel substrate; a gate insulation layer formed on the entire surface of the pixel substrate to cover the active layer; a gate electrode formed on the gate insulation layer; an interlayer insulation layer formed on the gate insulation layer to cover the gate electrode; and source and drain electrodes formed on the interlayer insulation layer and electrically connected to the active layer through a contact-hole of the interlayer insulation layer.

In an aspect of the present invention, the wires and the pads may be formed above the interlayer insulation layer.

According to an aspect of the present invention, an organic light emitting display includes a substrate; a pixel region formed on the substrate; an electrode formed over the pixel region; connection wires electrically connected to the electrode; and a passivation layer formed over the connection wires and entirely over the electrode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which:

FIGS. 6A, 6B, and 6C are views illustrating scratched wires in a related organic light emitting display, in which

DETAILED DESCRIPTION OF THE EMBODIMENTS

Reference will now be made in detail to the aspects of the present invention, examples of which are illustrated in the accompanying drawings, wherein like reference numerals refer to the like elements throughout. The aspects are described below in order to explain the present invention by referring to the figures.

In the figures, the dimensions of layers and regions may be exaggerated for clarity. It will also be understood that when a layer or element is referred to as being "on" or "over" another layer or substrate, it can be directly on the other layer or substrate, or intervening layers may also be present. Further, it will be understood that when a layer is referred to as being "under" or "below" another layer, it can be directly under, or one or more intervening layers may also be present.

Figure 1:
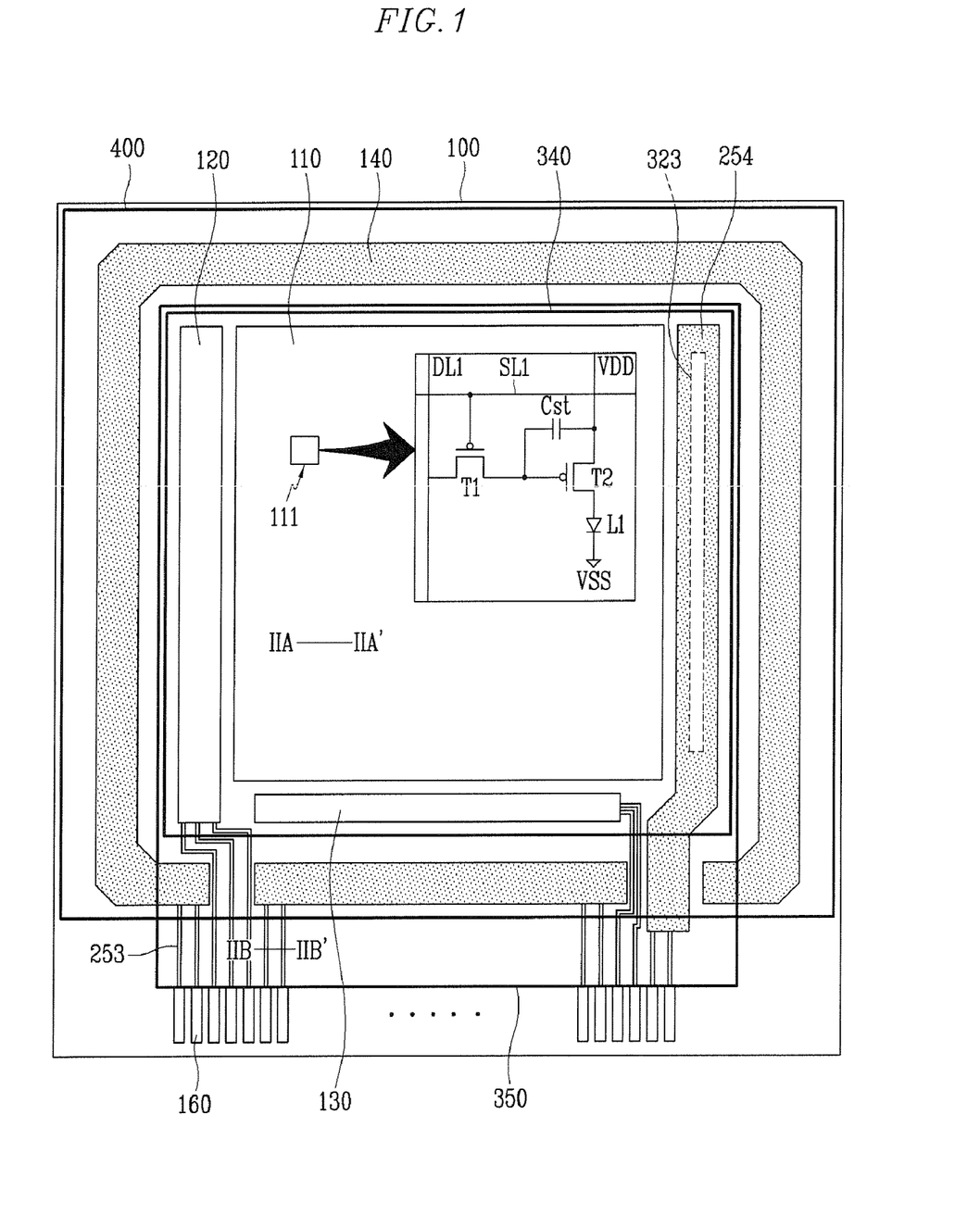
FIG. 1 is a plan view illustrating an organic light emitting display according to an aspect of the present invention.

An organic light emitting display according to an aspect of the present invention will now be described with reference to FIGS. 1 and 2. Referring to FIG. 1, the organic light emitting display includes a pixel substrate 100 and a pixel region 110 formed on the pixel substrate 100. The pixel region 110 is where an image is displayed.

The organic light emitting display also includes a plurality of pixels 111 that are basic units for an image display. The pixels 111 are arranged on the pixel regions 110 in a matrix form. Provided around the pixel region 110 are wires 253 (also known as connection wires) having pads 160, a scan driver 120 and a data driver 130 connected to the wires 253 to drive the pixel region 110 in response to a signal input through the pads 160, a power line 140 to supply a power voltage to the pixels 111, and a second pixel electrode wire 254 to supply a voltage of a negative polarity to a second pixel electrode 340 to be described later.

The second pixel electrode 340 is formed over the entire surface of the pixel region 110 and contacts the second pixel electrode wire 254 through a via-hole 323. Thus, the second pixel electrode 340 supplies a common voltage of the negative polarity to the pixels 111 arranged in the pixel region 110. As shown in FIG. 1, the second pixel electrode 340 may be formed above the scan driver 120 and the data driver 130. A passivation layer 350 is formed above the second pixel electrode 340 and the wires 253. The passivation layer 350 may be formed over the entire surface of the second pixel electrode 340.

The pixels 111 may be constructed with a switching first TFT T1, a driving second TFT T2, a storage capacitor Cst, and an organic light emitting element L1. However, aspects of the present invention are not limited thereto. For example, the pixels 111 may be constructed with two or more switching TFTs, two or more driving TFTs, and two or more storage capacitors. In various aspects, any OLED switching, driving, and/or storage structure, and/or numbers thereof are within the scope of the present invention.

In the aspect shown, the first TFT T1 is connected to a scan line SL1 and a data line DL1 so as to transmit a data voltage to the second TFT T2. The data voltage is input from the data line DL1 in response to a switching voltage input to the scan line SL1. The capacitor Cst is connected to the first TFT T1 and a power line VDD to store a voltage $V_{gs}$ corresponding to a difference between a voltage supplied from the first TFT T1 and a voltage supplied to the power line VDD.

The second TFT T2 is connected to the power line VDD and the capacitor $C_{st}$ to supply an output current $I_d$ to the organic light emitting element L1. In this aspect, the output current $I_d$ is in proportion to a square of a difference between the voltage $V_{gs}$, stored in the capacitor $C_{st}$, and a threshold voltage $V_{th}$. The output current $I_d$ enables the organic light emitting element L1 to emit light. In this aspect, the output current $I_d$ may be expressed by Formula 1, where β denotes a proportionality constant.

$$I_d = (\beta/2) \times (V_{gs} - V_{th})^2 \quad \text{[Formula 1]}$$

Referring back to FIG. 1, an encapsulation substrate 400 is formed above the pixel substrate 100 so as to protect the pixel region 110.

Figure 2:
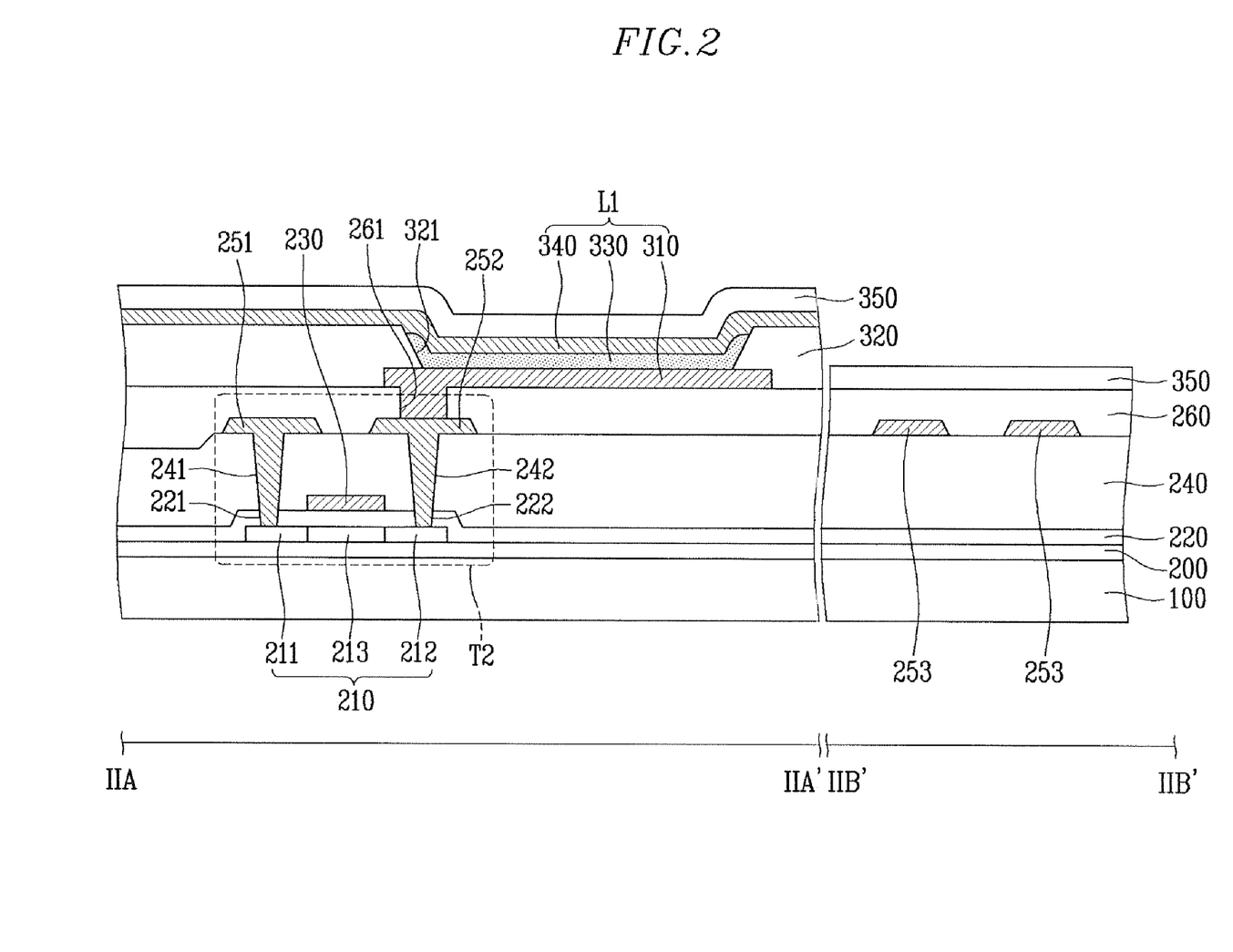
FIG. 2 is a cross-sectional view of the organic light emitting display of FIG. 1, taken along lines IIA-IIA' and IIB-IIB' of FIG. 1.

Referring to FIG. 2, the structures of the pixels 111 and the wires 253 of the pixel substrate 100 will now be described in greater detail. As shown, a buffer layer 200 is formed on a substrate 100. An active layer 210 is formed on the buffer layer 200. The active layer 210 is formed with source and drain regions 211 and 212, and a channel region 213 interposed therebetween. A gate insulation layer 220 is formed above the buffer layer 200 so as to cover the active layer 210. A gate electrode 230 is formed on the gate insulation layer 220 above the active layer 210. An interlayer insulation layer 240 is formed above the gate insulation layer 220 so as to cover the gate electrode 230. Source and drain electrodes 251 and 252 are electrically connected to the source and drain regions 211 and 212, respectively, through the gate insulation layer 220 formed on the interlayer insulation layer 240 and through first contact-holes 221 and 241 and second contact-holes 222 and 242 formed in the interlayer insulation layer 240, to thereby constitute the second TFT T2. By way of example, wires 253 are formed on the interlayer insulation layer 240 around the pixel regions 110 (see FIG. 1).

The substrate 100 may be made of an insulating material and/or a metal material. The insulating material may be glass, plastic, and/or other insulator. The metal material may be stainless steel (SUS), and/or other metal. The buffer layer 200 prevents or reduces impurities from diffusing from the substrate 100, for example, when the active layer 210 is formed. By way of example, the buffer layer 200 may be a silicon nitride (SiN) layer or a laminated silicon nitride (SiN) and a silicon oxide (SiO$_2$) layers. The gate electrode 230 may be constructed with a metal layer, for example, a MoW layer, an Al layer, a Cr layer, an Al/Cr layer, and/or other layer. The source and drain electrodes 251 and 252 may be formed with a metal layer, for example, a Ti/Al layer, a Ti/Al/Ti layer, and/or other layer.

A planarization layer 260 covers the second TFT T2, the wires 253, and the pads 160 (see FIG. 1), and is formed above the interlayer insulation layer 240. The pads 160 may be open or exposed above the pixel substrate 100 through a pad contact-hole 262 (see FIG. 5) formed in the planarization layer 260. A first pixel electrode 310 is formed on the planarization layer 260 and is electrically connected to the drain electrode 252 of the second TFT T2 through a via-hole 261 formed in the planarization layer 260.

An organic emission layer 330 is formed on the first pixel electrode 310. A second pixel electrode 340 is formed over the entire surface of the pixel region 110 (see FIG. 1) above the organic emission layer 330, to thereby form the organic light emitting element L1. The passivation layer 350 is formed on the planarization layer 260 above the second pixel electrodes 340 and the wires 253. The passivation layer 350 may be formed over the entire surface of the second pixel electrode 340.

The first pixel electrode 310 is electrically separated from a first pixel electrode (not shown) of an adjacent pixel by a pixel definition layer 320. The first pixel electrode 310 comes in contact with the organic emission layer 330 through an opening portion 321 of the pixel definition layer 320. The first pixel electrode 310 serves to inject positive holes. The second pixel electrode 340 serves to inject electrons.

The first pixel electrode 310 may be constructed with a first transparent electrode (not shown) made of indium tin oxide (ITO) and/or indium zinc oxide (IZO). Depending on a light emitting direction of the organic light emitting element L1, a conductive reflection layer and a second transparent electrode may be further formed on the first transparent electrode. The reflection layer serves to increase light emission efficiency by reflecting light generated from the organic emission layer 330 and to improve electrical conductivity. For example, the reflection layer may be made of Al, Al-alloy, Ag, Ag-alloy, Au, Au-alloy, and/or other material. The second transparent electrode (not shown) serves to improve a work function relationship between the organic emission layer 330 and the reflection layer while restricting oxidation of the reflection layer. Similar to the first transparent electrode, the second transparent electrode may be made of ITO and/or IZO.

The organic emission layer 330 may further include an emission layer (not shown), in which light is emitted, and an organic layer (not shown) which is disposed above and below the emission layer so as to effectively transmit carriers, such as positive holes or electrons, to the emission layer. For example, the organic layer may include at least one selected from a hole injection layer (formed between the emission layer and the first pixel electrode 310), a hole transporting layer, an electron transporting layer (formed between the emission layer and the second pixel electrode 340), and an electron injection layer.

Depending on the light emitting direction of the organic light emitting element L1, the second pixel electrode 340 may be formed with a transparent conductive layer or an opaque conductive layer (both not shown). If formed of the transparent conductive layer, the second pixel electrode 340 may have a thickness in the range of 100 to 180 Å. In addition, the transparent conductive layer may be made of IZO, ITO, MgAg, and/or other material. The opaque conductive layer may be made of Al, and/or other material.

According to the aforementioned aspect, the passivation layer 350 is formed above the second pixel electrode 340 and the wires 253. Thus, even if the wires 253 are not encapsulated by the encapsulation substrate 400, the passivation layer 350 can protect the wires 253 against externally imposed physical impact (or damage). As a result, the wires 253 are not scratched, and an electrical short or an open circuit between the wires 253 can be prevented or reduced. Therefore, pixel driving can be prevented or reduced from performing erroneously.

Figure 3A:
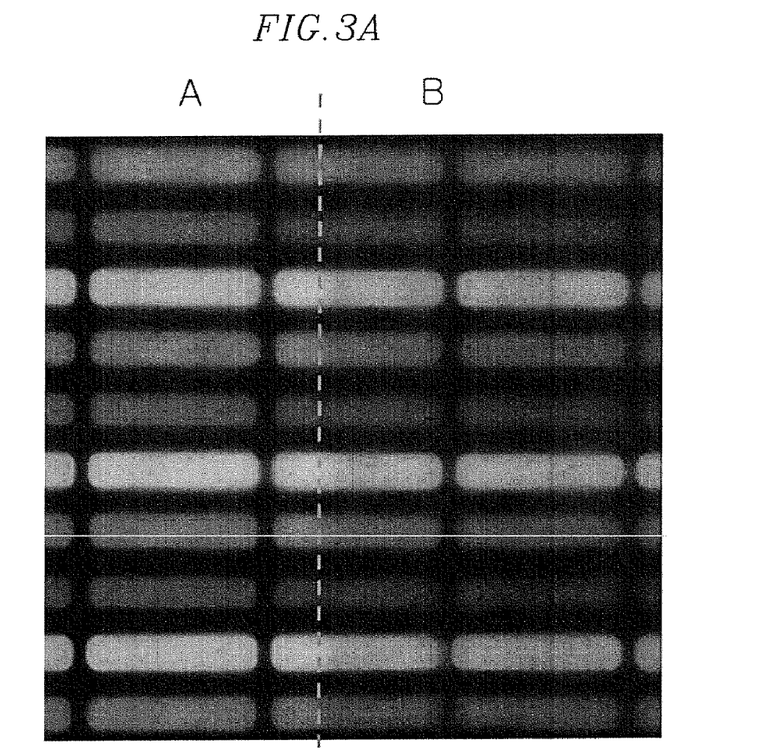
FIGS. 3A and 3B are views to compare an emission image of the organic light emitting display of FIG. 1 and an emission image of an organic light emitting display of a comparative example.
Figure 3B:
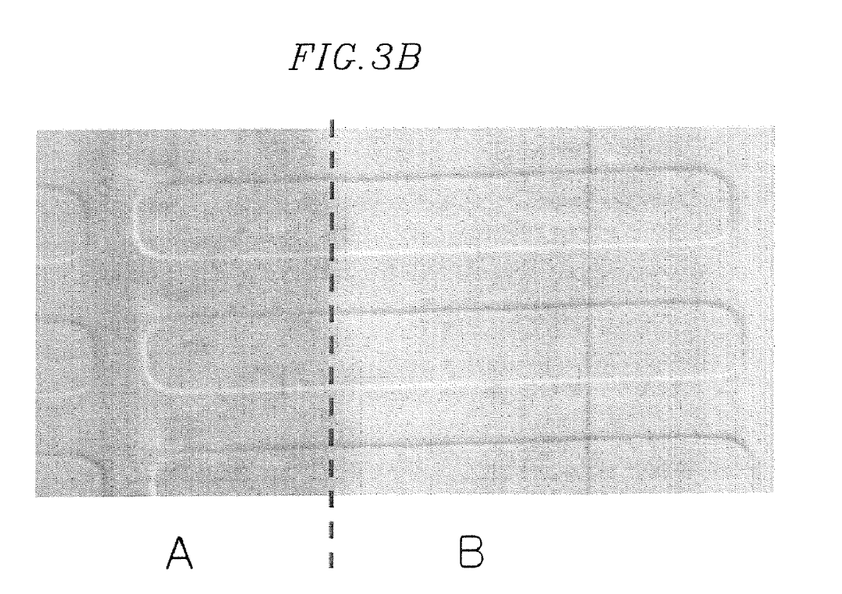

Furthermore, the passivation layer 350 prevents or reduces the occurrence of dark spots when a pin hole (see FIG. 7) is present in the second pixel electrode 340 formed to be thin and in the shape of the front electrode. FIGS. 3A and 3B show an emission image in a case A of an aspect of the present invention having the passivation layer 350 in comparison with an emission image in a case B of a comparison aspect without the passivation layer 350. In the case B, degradation in brightness occurs rapidly.

Figure 4:
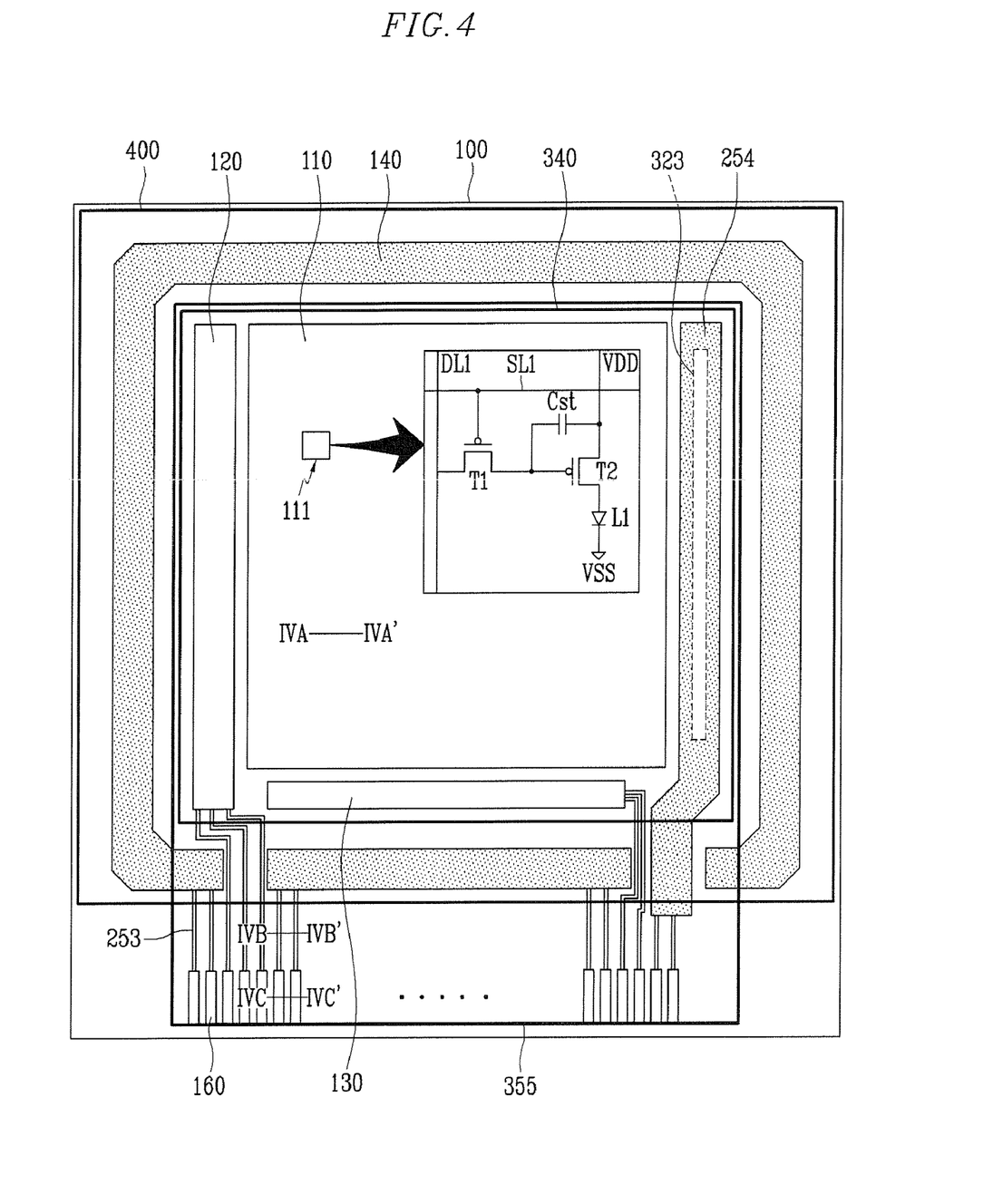
FIG. 4 is a plan view illustrating an organic light emitting display according to another aspect of the present invention.
Figure 5:
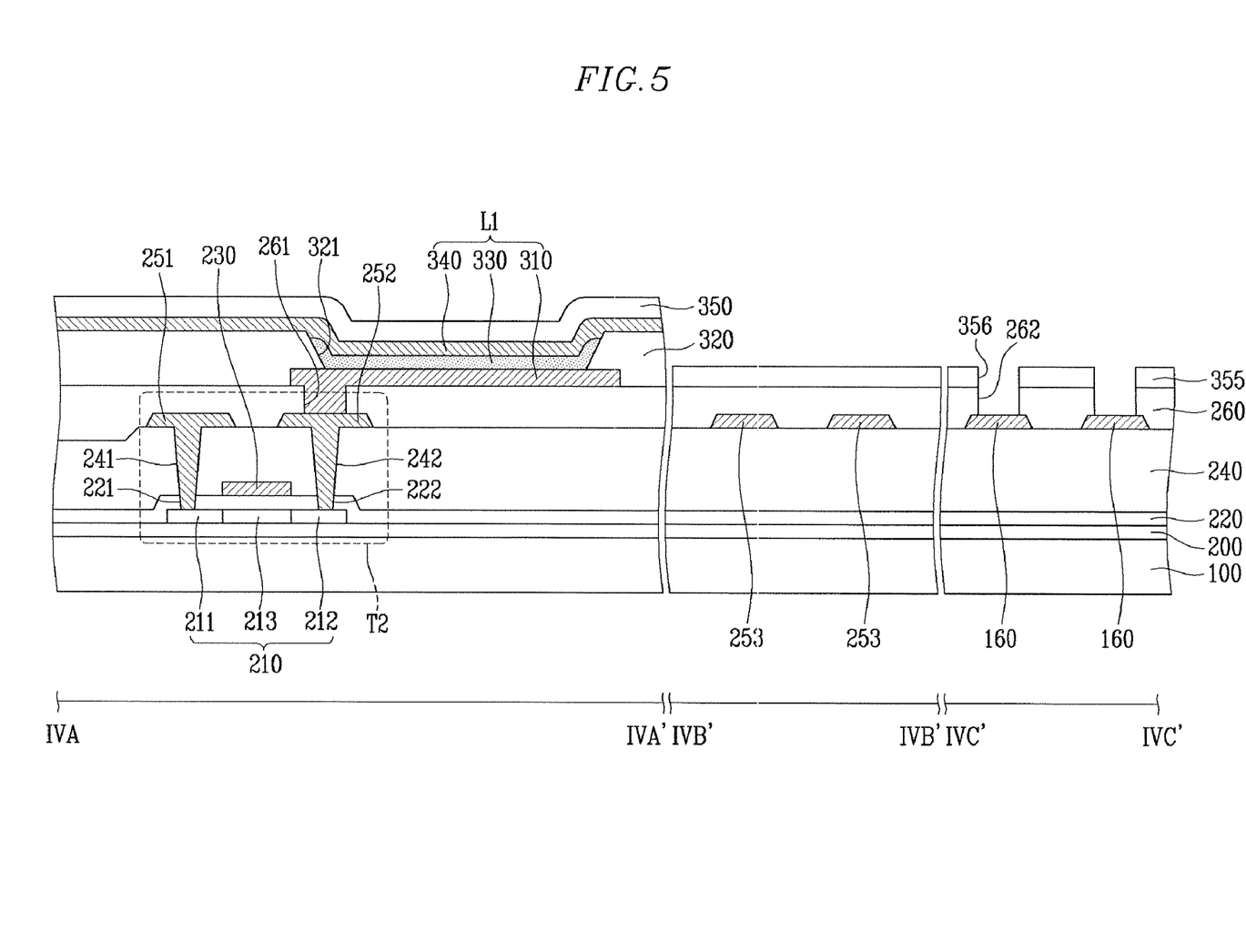
FIG. 5 is a cross-sectional view of the organic light emitting display of FIG. 4, taken along lines IVA-IVA', IVB-IVB', and IVC-IVC'.

Although the passivation layer 350 is formed above the second pixel electrode 340 and the wires 253 in the various aspects, a passivation layer 355 may be also formed above or on the pads 160 as shown in FIG. 4. In this aspect, as shown in FIG. 5, an opening portion 356 passing through the pad contact-hole 262 of the planarization layer 260 may be formed in the passivation layer 355, so that the pads 160 are open or exposed above the pixel substrate 100.

In various aspects, the wires 253 are formed on or over the planarization film 260. It is understood that in other aspects, the wires 253 may be formed on other layers or films, such as the buffer layer 200 or the gate insulating layer 220.

In various aspects, the passivation layer may be an oxide, a nitride, other ceramics, or other materials. If an oxide, the passivation layer may be silicon oxide, aluminum oxide or other material. If a nitride, the passivation layer may be silicon nitride, or other material. In various aspects, any combinations thereof are within the scope of the present invention.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. An organic light emitting display, comprising:
   a pixel substrate comprising a pixel region and a peripheral region disposed adjacent to the pixel region;
   an interlayer insulation layer disposed on the pixel substrate;
   a planarization layer disposed on the interlayer insulation layer;
   pads disposed on the interlayer insulation layer and in the peripheral region;
   wires disposed between the interlayer insulation layer and the planarization layer and extending from the pads to the pixel region;
   an organic light emitting element disposed on the planarization layer and in the pixel region;
   a passivation layer disposed on the organic light emitting element and completely covering the planarization layer; and
   an encapsulation substrate disposed on the pixel substrate to protect the pixel region.

2. The organic light emitting display of claim 1, wherein the organic light emitting element comprises a first pixel electrode, an organic emission layer, and a second pixel electrode that are sequentially laminated.

3. The organic light emitting display of claim 2, wherein the second pixel electrode is formed over the entire surface of the pixel region.

4. The organic light emitting display of claim 3, wherein the passivation layer is formed over the entire surface of the second pixel electrode.

5. The organic light emitting display of claim 1, further comprising a thin film transistor, wherein,
   the organic light emitting element is formed on the thin film transistor, and
   the planarization layer is formed between the organic light emitting element and the thin film transistor to cover the wires and the pads.

6. The organic light emitting display of claim 5, wherein a via-hole is formed in the planarization layer, and the organic light emitting element is electrically connected to the thin film transistor through the via-hole.

7. The organic light emitting display of claim 5, wherein the thin film transistor comprises:
   an active layer formed on the pixel substrate;
   a gate insulation layer formed on the entire surface of the pixel substrate to cover the active layer;
   a gate electrode formed on the gate insulation layer; and
   source and drain electrodes formed on the interlayer insulation layer and electrically connected to the active layer through a contact-hole of the interlayer insulation layer,
   wherein the interlayer insulation layer covers the gate electrode.

8. The organic light emitting display of claim 7, wherein the wires and the pads are formed directly on a surface of the interlayer insulation layer that faces away from the pixel substrate.

9. The organic light emitting display of claim 1, wherein:
   the planarization layer and the passivation layer cover the pads and the wires; and
   a pad contact-hole is formed in the planarization layer and the passivation layer, so as to expose the pads.

* * * * *